(12) United States Patent
Bohlinger et al.

(10) Patent No.: US 7,271,586 B2
(45) Date of Patent: Sep. 18, 2007

(54) SINGLE PACKAGE DESIGN FOR 3-AXIS MAGNETIC SENSOR

(75) Inventors: Michael J. Bohlinger, Minnetonka, MN (US); Hong Wan, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 180 days.

(21) Appl. No.: 11/022,495

(22) Filed: Dec. 22, 2004

(65) Prior Publication Data

US 2005/0122101 A1     Jun. 9, 2005

Related U.S. Application Data

(63) Continuation-in-part of application No. 10/789,682, filed on Feb. 27, 2004, now Pat. No. 7,095,226.

(60) Provisional application No. 60/527,368, filed on Dec. 4, 2003.

(51) Int. Cl.
*G01R 33/02* (2006.01)
(52) U.S. Cl. .................................. 324/247
(58) Field of Classification Search ................ 324/244, 324/247, 249, 251, 252, 260, 261; 33/319, 33/366.12, 255 R; 338/32 R, 32 H
See application file for complete search history.

(56) References Cited

U.S. PATENT DOCUMENTS

| | | | | |
|---|---|---|---|---|
| 5,433,110 A | * | 7/1995 | Gertz et al. | 73/514.35 |
| 5,850,624 A | * | 12/1998 | Gard et al. | 702/92 |
| 6,818,985 B1 | * | 11/2004 | Coccioli et al. | 257/728 |
| 7,173,420 B2 | * | 2/2007 | Tamura | 324/247 |
| 2003/0005569 A1 | | 1/2003 | Hiatt et al. | |
| 2003/0070282 A1 | | 4/2003 | Hiatt et al. | |
| 2004/0084211 A1 | | 5/2004 | Fayfield | |
| 2004/0164734 A1 | | 8/2004 | Fayfield et al. | |
| 2005/0270020 A1 | * | 12/2005 | Peczalski et al. | 324/247 |
| 2006/0006863 A1 | * | 1/2006 | Adachi et al. | 324/247 |

FOREIGN PATENT DOCUMENTS

JP          2002162289          1/2004

OTHER PUBLICATIONS

Kawahito et al., Micromachined Hall Elements for Two-Dimensional Magnetic Field Sensing, 1994, Sensor and Actuators, February No. 2, all pages.*
Van Zant, Microchip Fabrication, 4th Edition; McGraw-Hill (2000); Chapter 18, pp. 557-593.
International Search Report and Written Opinion for PCT Application No. PCT/US2005/045372.

* cited by examiner

*Primary Examiner*—Edward Lefkowitz
*Assistant Examiner*—Kenneth J Whittington
(74) *Attorney, Agent, or Firm*—McDonnell Boehnen Hulbert & Berghoff LLP

(57) ABSTRACT

A sensor package comprising an X-axis sensor circuit component, a Y-axis sensor circuit component, and a Z-axis sensor circuit component, each mounted to a top surface of a rigid substrate. To minimize the height of the package, a channel is cut out of the top surface of the substrate in order to accommodate the Z-axis sensor component. On the Z-axis sensor component, input/output (I/O) pads are all arranged in an array along one edge of the sensor to conductively cooperate with I/O pads, or solder-filled vias, on the substrate located at a top edge of the channel. Once the sensors have all been mounted to the substrate, the package is encapsulated, and the overall height is less than 1.2 mm.

20 Claims, 6 Drawing Sheets

SINGLE PACKAGE DESIGN FOR 3-AXIS MAGNETIC SENSOR

PRIORITY

This utility application is a continuation-in-part (CIP) of U.S. patent application Ser. No. 10/789,682, filed Feb. 27, 2004, now U.S. Pat. No. 7,095,226 the disclosure of which is expressly incorporated herein by reference, and which claims priority to Provisional Patent Application Ser. No. 60/527,368, filed Dec. 4, 2003.

BACKGROUND OF THE INVENTION

1. Field of the Invention

The present invention relates generally to methods of manufacturing sensor packages and the packages produced by such methods. More specifically, the present invention relates to the design and manufacture of a 3-axis sensor package in order to minimize the vertical height of the package on a printed circuit board (PCB).

2. Description of the Related Art

The Earth's magnetic field intensity is about 0.5 to 0.6 gauss and has a component parallel to the Earth's surface that always points toward magnetic north. This field can be approximated with a dipole model—the field always points north, but the angle of the field relative to the surface of the Earth changes from horizontal at the equator to sub-horizontal (i.e., "down" toward the ground) in the northern hemisphere and supra-horizontal (i.e., "up" toward the air) in the southern hemisphere. In all cases, the horizontal direction of the Earth's field points toward magnetic north and is used to determine compass direction.

Magnetic sensors have been in use for well over 2,000 years, primarily used to sense the Earth's magnetic field for direction finding or navigation. Today, magnetic sensors are still a primary means of navigation and many other uses have evolved. As a result, magnetic sensors may be found in medical, laboratory, and electronic instruments; weather buoys; virtual reality systems; and a variety of other systems.

Modern consumer and commercial electronic equipment design has generally involved the consolidation of numerous disparate functions into a single device and the evolution of devices of increasingly diminutive scale. Small devices and devices that incorporate numerous functions require their internal components to be as small as possible. The desire to incorporate wayfinding and navigation technology into such compact devices requires the requisite 2- and 3-dimensional sensors, for example magnetic sensors and/or tilt sensors, to be of minimum height in the Z-axis (i.e., out of the plane of the PCB). Mounting a vertical sensor along the Z-axis is a challenge for the semiconductor assembly industry, especially for applications that have space limitations. Current methods fail to mount vertical (Z-axis) sensors for applications with limited space and cost sensitive, high volume, standard PCB processes.

Therefore, a need exists for mounting of 3-axis sensors in a low profile manner in, for example, cell phone and other consumer and commercial applications. Such needs should be filled by applications that are cost sensitive, high volume, and easily adaptable to common PCB assembly processes.

SUMMARY OF THE INVENTION

In one aspect of the invention, a sensor package is provided comprising an X-axis sensor circuit component, a Y-axis sensor circuit component, or alternatively a combined X/Y-axis sensor circuit component, and a Z-axis sensor circuit component, each mounted to a top surface of a rigid substrate, or alternatively to a printed circuit board (PCB). The substrate has preferred dimensions of 3 mm by 3 mm with sixteen input/output (I/O) pads. The pads may be arranged in variety of designs, including a leadless chip carrier (LCC) design and a ball grid array (BGA) design. Either the X- and Y-axis, or the X/Y-axis, sensors are mounted to the top surface of the substrate. To minimize the height of the package, a channel is provided in the top surface of the substrate in order to accommodate the Z-axis sensor component. The channel has a width corresponding to a thickness of the Z-axis sensor.

All three sensors have input/output (I/O) pads for conductively connecting to the substrate. The I/O pads on the X- and Y-axis and X/Y-axis sensors are arranged on a side of the sensor that faces the substrate, and cooperate with the corresponding I/O pads located on the top surface of the substrate, which are in the form of solder-filled vias. On the Z-axis sensor component, the I/O pads are all arranged in an array along one edge of the sensor and cooperate with I/O pads on the substrate, solder filled vias, located at a top edge of the channel. Once the sensors have all been mounted to the substrate, the package is encapsulated. After encapsulation, the overall height of the package is less than 1.2 mm.

In a second aspect of the invention, a method for mounting a Z-axis sensor circuit component is provided. The Z-axis sensor circuit component has all of its I/O pads arranged in a vertical array along one edge of the sensor. The I/O pads are formed along the edge of the Z-axis sensor and bumps of solder are placed on the pads. The method comprises cutting a channel out of a rigid substrate, the channel having a width corresponding to the thickness of the Z-axis sensor and a depth long enough so the Z-axis sensor will not extend past the top surface of the substrate further than the X- and Y-axis sensors. During the formation of the channel, vias are created at a top edge of the channel. These vias are then filled with solder. The Z-axis sensor is positioned in such a way that it can measure the magnetic field in the Z-axis, and then inserted into the channel with the bumped pads resting on the surface of the substrate so they make contact with the solder filled vias. Then, a standard re-flow process can be used to create a conductive connection between the Z-axis sensor and the rigid substrate. The package is then encapsulated and the overall height of the package is less than 1.2 mm.

DETAILED DESCRIPTION OF THE DRAWINGS

Figure 1:
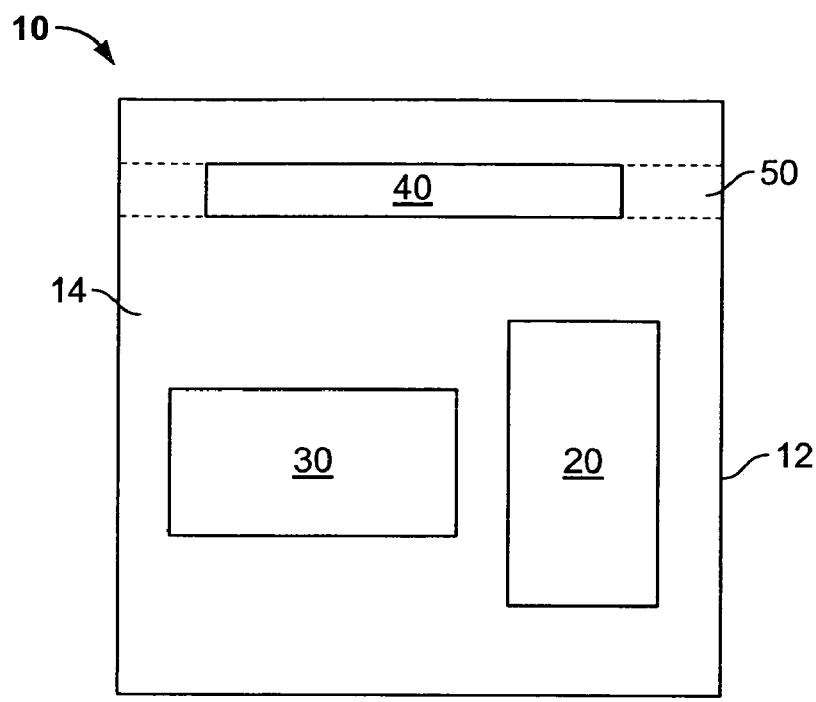
FIG. 1 is a schematic diagram of a sensor package comprising an X-axis sensor, a Y-axis sensor, and a Z-axis sensor attached to a rigid substrate.

Referring to FIG. 1, there is illustrated the construction of a three-axis sensor package of the invention generally designated by the reference number 10. The three-axis sensor includes a rigid substrate 12 with a top surface 14 to which sensor circuit components (i.e., sensors) 20, 30, and 40 are mounted. The sensors could alternatively be mounted onto a printed circuit board (PCB). The substrate has preferred dimensions of 3 mm by 3 mm with sixteen input/output (I/O) pads. The pads may be arranged in a variety of designs, including a leadless chip carrier (LCC) design, shown in FIG. 9, and a ball grid array (BGA) design, shown in FIG. 10. An X-axis sensor circuit component 20 is sensitive to magnetic forces along the X-axis, and a Y-axis sensor circuit component 30 is sensitive to magnetic forces along the Y-axis.

Figure 2:
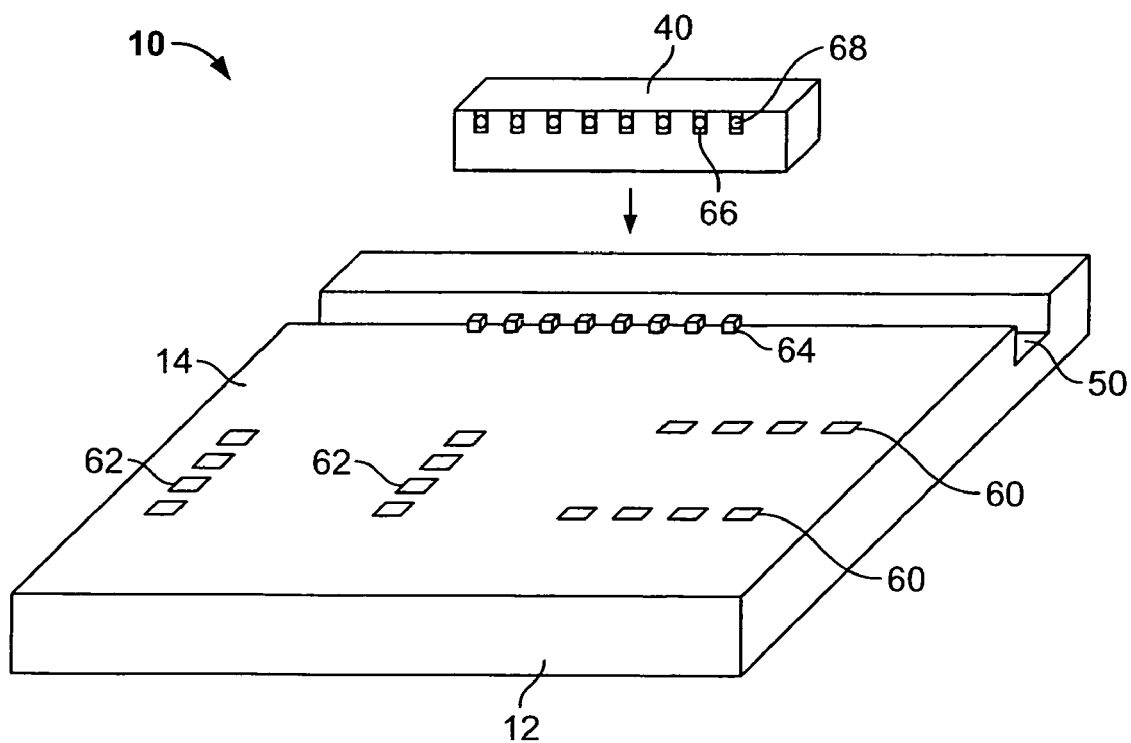
FIG. 2 is a schematic diagram of a sensor package demonstrating the configuration of the I/O pads on the substrate that align with the I/O pads on each of 3 sensors.

Both sensors 20 and 30 are mounted to the substrate 12 using a standard flip chip re-flow sensor attach process. Generally, sensors can also be mounted to a substrate using other standard chip-on-board techniques including wire bonding and tape automated bonding (TAB). The X- and Y-axis sensors have input/output (I/O) pads, not shown, that conductively connect to corresponding I/O pads 60, 62 located on the substrate 12, and which are in the form of solder-filled vias, as best shown in FIG. 2.

Figure 3:
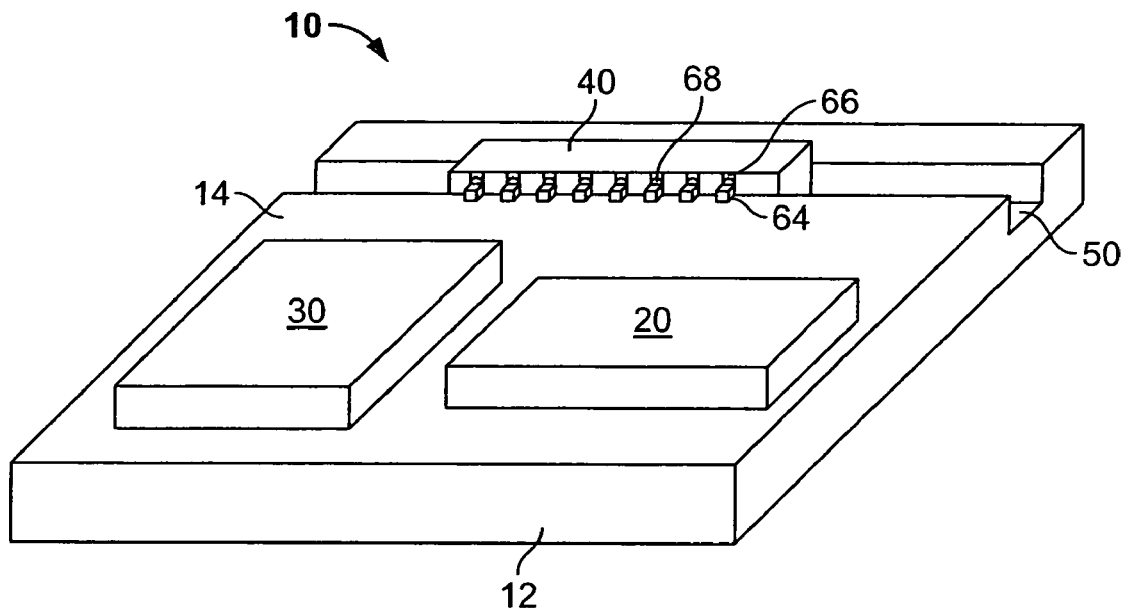
FIG. 3 is a schematic diagram of a sensor package demonstrating the configuration of 3 sensors and the alignment of the I/O pads on the Z-axis sensor.
Figure 4A:
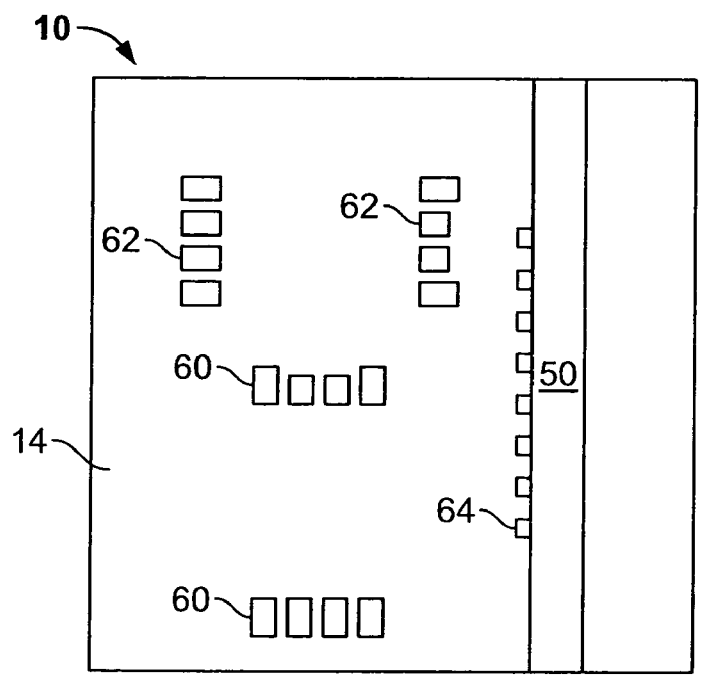
FIG. 4A is a top view schematic diagram the sensor package shown in FIG. 3 demonstrating the configuration of the I/O pads.
Figure 4B:
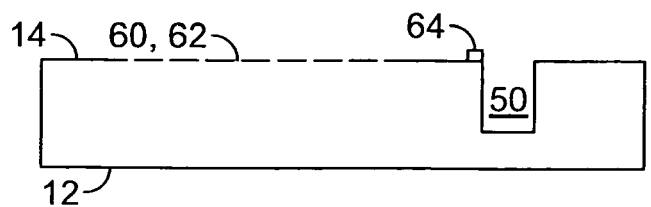
FIG. 4B is a side view schematic diagram of the sensor package shown in FIG. 3 demonstrating the channel cut in the substrate.
Figure 4C:
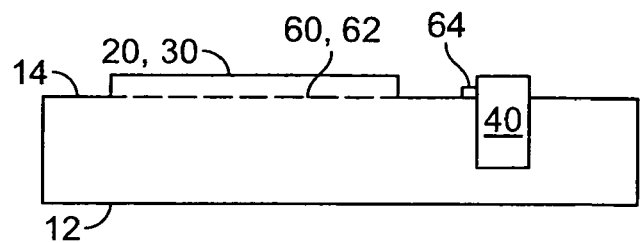
FIG. 4C is a side view schematic diagram of the sensor package shown in FIG. 3 demonstrating the configuration of the sensors on the substrate.
Figure 4D:
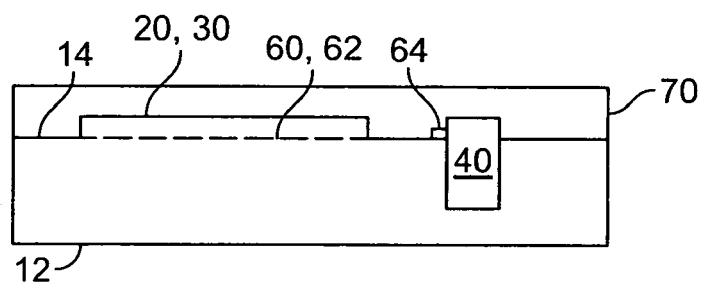
FIG. 4D is a side view schematic diagram of the sensor package shown in FIG. 3 demonstrating the encapsulation of the package.
Figure 8:
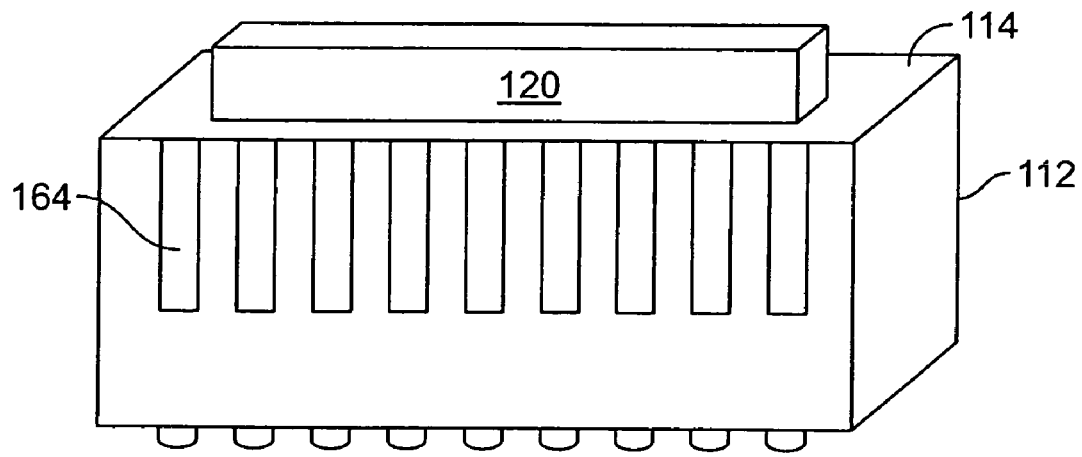
FIG. 8 is a cross-sectional view of the sensor package shown in FIG. 6 demonstrating the configuration of solder-filled vias.

The sensor package also contains a Z-axis sensor circuit component 40 which is sensitive to magnetic forces along the Z-axis. The Z-axis sensor is located in a channel 50 formed on the top surface 14 of the substrate 12. The width of the channel 50 corresponds to the thickness of the Z-axis sensor 40, and the depth of the channel is of such dimension so that the Z-axis sensor 40 will not extend vertically further than the top surfaces of the X- and Y-axis sensors, as shown in FIGS. 4C and 4D. The Z-axis sensor 40 further has I/O pads 66 including solder bumps 68 arranged in a vertical array along only one edge of the sensor. As best seen in FIG. 3, the pads 66 conductively communicate with corresponding solder-filled vias 64 created during the formation of the channel 50 in the substrate 12. The solder-filled vias 64 extend completely through the substrate 12, as shown in FIG. 8. With the sensor solder bumps 68 touching the vias 64, a standard re-flow process can be used to make the Z-axis sensor 40 connection along with the X- and Y-axis sensors.

With reference to FIGS. 3 and 4, once the sensors have all been securely mounted to the substrate, the package is encapsulated with an encapsulation layer 70, as best shown in FIG. 4D. Encapsulation is a batch process where a panel of devices are covered or filled with encap material, cured, and sawed into individual devices. This process is standard in the custom packaging art. After encapsulation, the overall height of the package is less than 1.2 mm.

Figure 5:
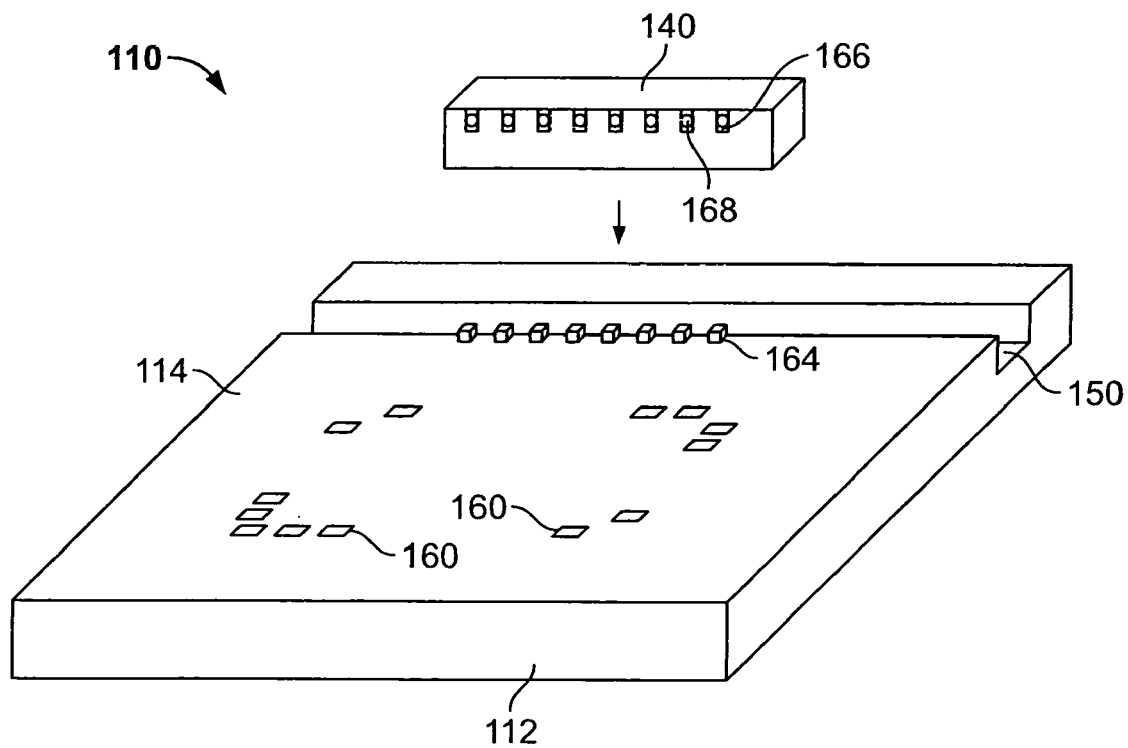
FIG. 5 is a schematic diagram of an alternate embodiment of the sensor package shown in FIG. 3 demonstrating the configuration of the I/O pads on the substrate that align with the I/O pads on each of 2 sensors.
Figure 6:
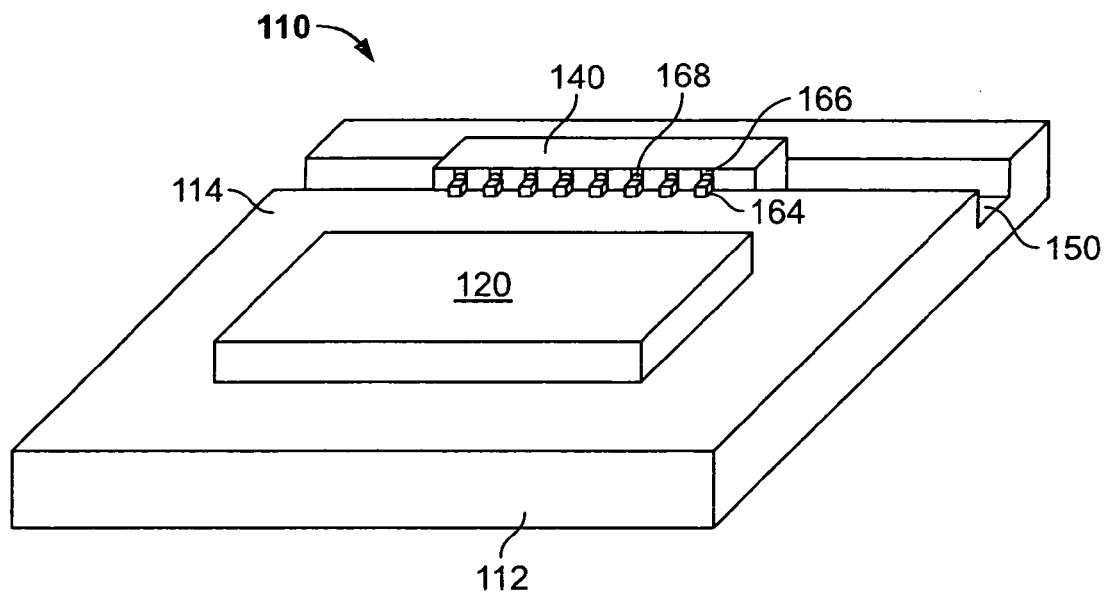
FIG. 6 is a schematic diagram of the board sensor package shown in FIG. 5 demonstrating the configuration of 2 sensors and the alignment of the I/O pads on the Z-axis sensor.
Figure 7A:
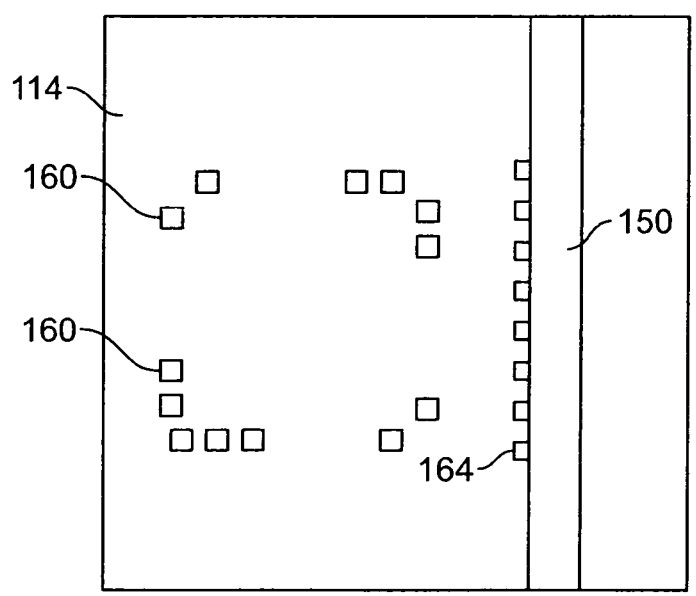
FIG. 7A is a top view schematic diagram of the sensor package shown in FIG. 6 demonstrating the configuration of the I/O pads.
Figure 7B:
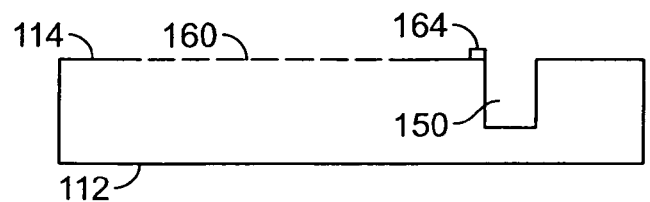
FIG. 7B is a side view schematic diagram of the sensor package shown in FIG. 6 demonstrating the channel cut in the substrate.
Figure 7C:
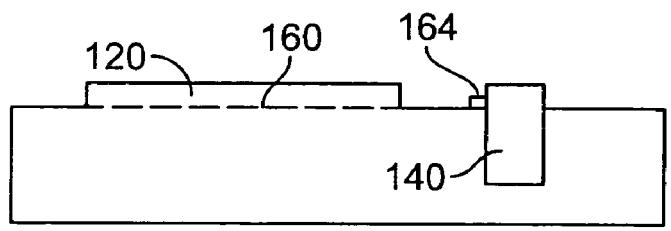
FIG. 7C is a side view schematic diagram of the sensor package shown in FIG. 6 demonstrating the configuration of the sensors on the substrate.
Figure 7D:
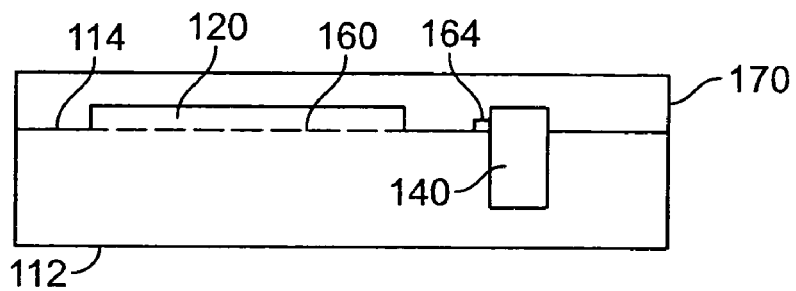
FIG. 7D is a side view schematic diagram of the sensor package shown in FIG. 6 demonstrating the encapsulation of the package.

FIGS. 5-7 show an alternate embodiment of the invention where a combined X/Y-axis sensor circuit component 120 is used instead of separate X- and Y-axis sensors. The combined sensor 120 is mounted on to the substrate 112 using I/O pads 160. A Z-axis sensor 140 is inserted into the channel 150 in the substrate 112 in the same manner as described above with respect to Z-axis sensor 40. As shown from the figures, the I/O pads 166 of the sensor 140 communicate with solder-filled vias 164.

Figure 9:
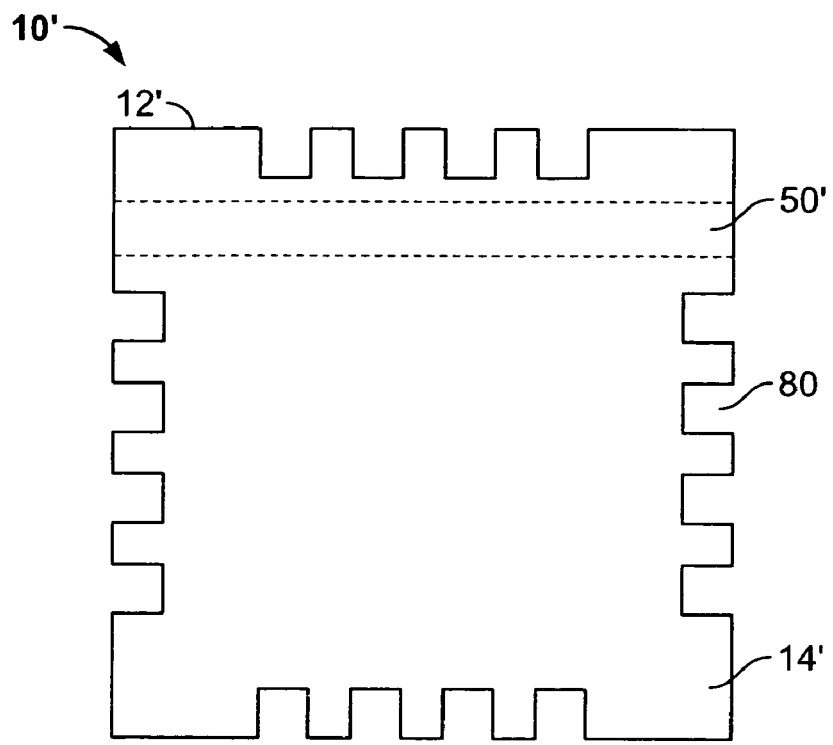
FIG. 9 is a schematic diagram of a leadless chip carrier (LCC) I/O substrate demonstrating the configuration of a channel.
Figure 10:
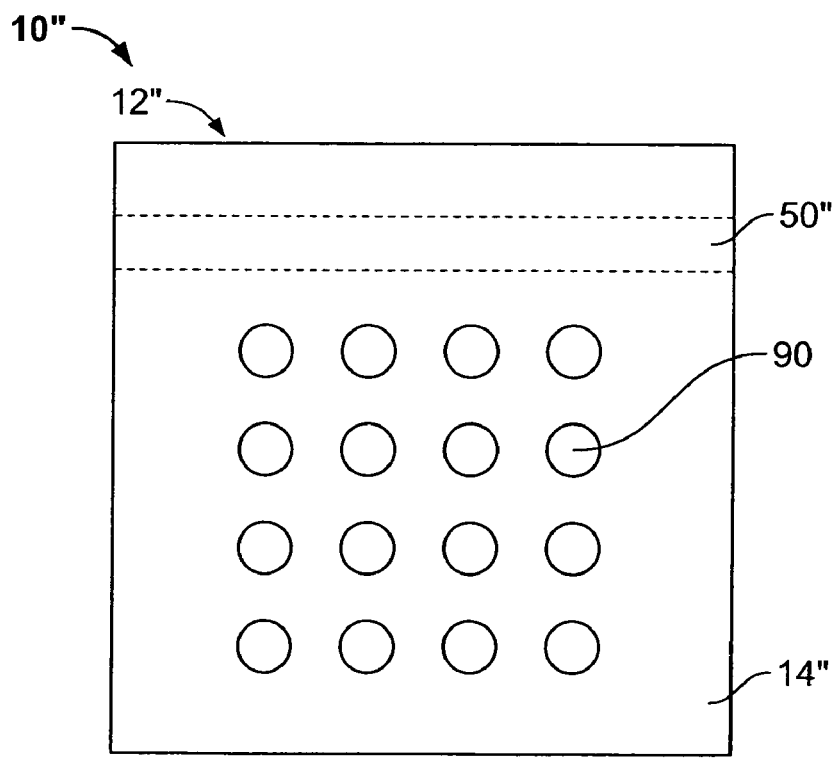
FIG. 10 is a schematic diagram of a ball grid array (BGA) I/O substrate demonstrating the configuration of a channel.

Referring to FIGS. 9 and 10, alternate designs for the sensor packages 10' and 10" are illustrated. FIG. 9 shows the configuration of a channel 50' for the Z-axis sensor on a leadless chip carrier (LCC) 12'. The LCC has I/O pads 80 along its outside perimeter for connecting to a PCB. The X- and Y-axis sensors are located in a single package (not shown) that lays on the top surface of the substrate, with each sensor having I/O pads for conductively connecting with corresponding I/O pads on the top surface of the substrate (not shown). On a LCC design, the corresponding I/O pads on the top surface of the substrate are in the form of solder filled vias that extend to a bottom surface of the substrate and come into contact with metal pads on the bottom surface (not shown). The vias then contact the metal pads, which in turn contact the I/O pads 80 on the outside perimeter. A conductive connection can then be established with the I/O pads 80 located on the outside perimeter of the substrate. The LCC pads are left exposed on the finished configuration.

FIG. 10 illustrates a channel 50" for a Z-axis sensor on a ball grid array (BGA) 12". The BGA has I/O pads in the form of balls of solder 90 placed on the top surface of the substrate for attaching to the X- and Y-axis sensors. The X- and Y-axis sensors are located in a single package (not shown) that lays on the top surface of the substrate. The BGA pads 90 are encapsulated on the finished configuration.

A method for mounting a Z-axis sensor circuit component is also provided. As described above, the Z-axis sensor circuit component has all of its I/O pads arranged in a vertical array along one edge of the sensor. These pads are solder bumped along the edge of the Z-axis sensor. The method comprises cutting a channel out of a rigid substrate, or alternatively a PCB, the channel having a width corresponding to the thickness of the Z-axis sensor and a depth long enough so the Z-axis sensor will not extend past the top surface of the substrate further than the X- and Y-axis sensors. During the formation of the channel, vias are created at a top edge of the channel. These vias are then filled with solder. The Z-axis sensor is positioned into the channel in the substrate in such a way so that it can measure magnetic field in the Z-axis. It is then inserted into the channel with the bumped pads resting on the surface of the substrate so they make contact with the solder filled vias. Solder paste is applied to hold the pads in place, and a standard re-flow process can then be used to create a conductive connection between the Z-axis sensor and the rigid substrate. The package is encapsulated and the overall height of the package is less than 1.2 mm.

For all the embodiments discussed above, the I/O pads on the sensor circuit components are preferably mounted onto the substrate using a method selected from the group consisting of wire bonding, flip chip, solder bumping, stud bumping, conductive epoxy, and flexible interconnect bonding, e.g., tape automated bonding (TAB), techniques. Alternately, the X-axis sensor circuit component can comprise I/O pads on the first face for conductive connection to a Y-axis sensor circuit component, and the I/O pads are preferably mounted onto the substrate using a method selected from the group consisting of wire bonding, flip chip, solder bumping, stud bumping, conductive epoxy, and flexible interconnect bonding, e.g., tape automated bonding (TAB), techniques. As such, the X-axis sensor circuit component can be conductively connected to the Y-axis sensor circuit component.

In still other embodiments, sensor circuit components are solid state sensors, while in other embodiments the sensor circuit components are magnetic sensors. In still other embodiments, the sensor circuit components are tilt sensors. In still other embodiments, one or more of the sensor circuit components can be one kind of sensor, for example, magnetic or tilt sensors, and the one or more other sensor circuit components can be a sensor of a different kind, for example, a solid state chip that can provide a vertical support edge. In still other embodiments, the one or more sensor components can be any kind of sensor, for example, magnetic or tilt sensors, and the one or more other sensor circuit components can be any solid state chip, whether or not it is an actual sensor, provided it comprises a sensor circuit component interface edge that can provide support for the sensor circuit component.

In certain embodiments, the Z-axis sensor circuit component is conductively connected to the substrate by a method selected from the group consisting of wire bonding, flip chip, solder bumping, stud bumping, conductive epoxy, and flexible interconnect bonding, e.g., tape automated bonding (TAB), techniques.

While certain features and embodiments of the present invention have been described in detail herein, it is to be understood that the invention encompasses all modifications and enhancements within the scope and spirit of the following claims.

We claim:

1. A sensor package comprising:
   a rigid substrate, the rigid substrate having a top surface, the top surface including a channel;
   an X-axis sensor attached to the rigid substrate and located on the top surface of the rigid substrate for sensing magnetic field along an X-axis, the X-axis sensor including input/output pads;
   a Y-axis sensor attached to the rigid substrate and located on the top surface of the rigid substrate for sensing magnetic field along a Y-axis, the Y-axis sensor including input/output pads;
   a Z-axis sensor attached to the rigid substrate and located in the channel in the top surface of the rigid substrate for sensing magnetic field along a Z-axis, the channel having a width that corresponds to substantially a thickness of the Z-axis sensor, and the Z-axis sensor including input/output pads; and
   corresponding input/output pads located on the top surface of the rigid substrate for conductively connecting to respective input/output pads on each sensor.

2. The sensor package of claim 1 further including an encapsulation layer around the package, the height of the package including the encapsulation layer being less than 1.2 mm.

3. The sensor package of claim 1 wherein the input/output pads on the Z-axis sensor are arranged in a vertical array along one edge of the sensor and conductively connect with the corresponding input/output pads on the rigid substrate.

4. The sensor package of claim 3, wherein the input/output pads on the Z-axis sensor are conductively connected to the rigid substrate by solder bumps.

5. The sensor package of claim 4 wherein the input/output pads on the rigid substrate comprise solder filled vias located at a top edge of the channel.

6. The sensor package of claim 1 wherein the input/output pads on the rigid substrate are arranged in a grid in the center of the top surface of the substrate in a ball grid array design.

7. The sensor package of claim 1 wherein the input/output pads on the rigid substrate are arranged on an outer perimeter in a leadless chip carrier design.

8. A sensor package comprising:
   a rigid substrate, the rigid substrate having a top surface, the top surface including a channel having a width and a depth;
   an X/Y-axis sensor attached to the rigid substrate and located on the top surface of the rigid substrate for sensing magnetic field along an X-axis and Y-axis, the X/Y-axis sensor including input/output pads;
   a Z-axis sensor attached to the rigid substrate and located in the channel in the top surface of the rigid substrate for sensing magnetic field along a Z-axis, the channel having a width that corresponds to substantially a thickness of the Z-axis sensor, and the Z-axis sensor including input/output pads;
   corresponding input/output pads located on the top surface of the rigid substrate for conductively connecting to respective input/output pads on each sensor; and
   an encapsulation layer around the package, the height of the package including the encapsulation layer being less than 1.2 mm.

9. The sensor package of claim 8 wherein the input/output pads on the rigid substrate are arranged on an outer perimeter in a leadless chip carrier design.

10. The sensor package of claim 8 wherein the input/output pads on the rigid substrate are arranged in a grid in the center of the top surface of the substrate in a ball grid array design.

11. The sensor package of claim 8 wherein the input/output pads on the Z-axis sensor are arranged in a vertical array along one edge of the sensor and conductively connect with the corresponding input/output pads on the rigid substrate.

12. The sensor package of claim 11, wherein the input/output pads on the Z-axis sensor are conductively connected to the rigid substrate by solder bumps.

13. The sensor package of claim 12 wherein the input/output pads on the rigid substrate comprise solder filled vias located at a top edge of the channel.

14. A sensor package comprising:
a rigid substrate, the rigid substrate having a top surface, the top surface including a channel having a width and a depth;
an X-axis sensor attached to the rigid substrate and located on the top surface of the rigid substrate for sensing magnetic field along an X-axis, the X-axis sensor including input/output pads;
a Y-axis sensor attached to the rigid substrate and located on the top surface of the rigid substrate for sensing magnetic field along a Y-axis, the Y-axis sensor including input/output pads;
a Z-axis sensor attached to the rigid substrate and located in the channel in the top surface of the rigid substrate for sensing magnetic field along a Z-axis, the channel having a width that corresponds to substantially a thickness of the Z-axis sensor, and the Z-axis sensor including input/output pads;
corresponding input/output pads located on the top surface of the rigid substrate for conductively connecting to respective input/output pads on each sensor; and
an encapsulation layer around the package, the height of the package including the encapsulation layer being less than 1.2 mm; and
wherein the input/output pads on the Z-axis sensor are arranged in a vertical array along one edge of the sensor and conductively communicate with the corresponding input/output pads on the rigid substrate.

15. The sensor package of claim 14, wherein the input/output pads on the Z-axis sensor are conductively connected to the rigid substrate by solder bumps.

16. The sensor package of claim 15 wherein the input/output pads on the rigid substrate comprise solder filled vias located at a top edge of the channel.

17. A method for manufacturing a sensor package by mounting a Z-axis sensor onto a rigid substrate, the rigid substrate having X- and Y-axis sensors mounted onto a top surface of the substrate, the method comprising:
cutting a channel out of the top surface of the rigid substrate;
forming vias on a top edge of the channel;
filling the vias with solder;
forming input/output pads along only one edge of the Z-axis sensor;
placing bumps of solder on the input/output pads;
inserting the Z-axis sensor into the channel with the bumped input/output pads resting on the top surface of the substrate and contacting the solder-filled vias; and
encapsulating the package.

18. The method of claim 17 wherein the step of cutting further comprises creating the channel with a width corresponding to the thickness of the Z-axis sensor, and a depth of a dimension so that the Z-axis sensor positioned in the channel will not extend past a top surface of the X- and the Y-axis sensors.

19. The method of claim 17 further comprising using a re-flow process for conductively connecting the Z-axis sensor and the rigid substrate.

20. The method of claim 17 wherein the total height of the package is less than 1.2 mm.

* * * * *